(12) United States Patent
Hsu et al.

(10) Patent No.: US 11,606,093 B2
(45) Date of Patent: Mar. 14, 2023

(54) LEVEL CONVERTING ENABLE LATCH

(71) Applicant: MEDIATEK INC., Hsin-Chu (TW)

(72) Inventors: Wei-Min Hsu, Hsinchu (TW); Jen-Hang Yang, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 17/368,866

(22) Filed: Jul. 7, 2021

(65) Prior Publication Data

US 2022/0103175 A1 Mar. 31, 2022

Related U.S. Application Data

(60) Provisional application No. 63/084,616, filed on Sep. 29, 2020.

(51) Int. Cl.
*H03K 3/356* (2006.01)
*H03K 19/0185* (2006.01)
*H03K 3/012* (2006.01)

(52) U.S. Cl.
CPC ..... *H03K 19/018521* (2013.01); *H03K 3/012* (2013.01); *H03K 3/356113* (2013.01); *H03K 3/356182* (2013.01)

(58) Field of Classification Search
None
See application file for complete search history.

(56) References Cited

U.S. PATENT DOCUMENTS

| | | | |
|---|---|---|---|
| 5,629,643 A * | 5/1997 | Moughanni | H03K 3/356121 327/199 |
| 6,518,810 B1 * | 2/2003 | Takahashi | H03K 3/012 327/202 |
| 6,563,357 B1 | 5/2003 | Hsu | |
| 7,391,250 B1 * | 6/2008 | Chuang | H03K 3/0375 326/46 |
| 7,590,900 B2 * | 9/2009 | Kim | G01R 31/318541 714/724 |
| 9,941,867 B1 * | 4/2018 | Weber | H03K 19/1776 |
| 10,651,832 B2 * | 5/2020 | Chen | G11C 11/417 |
| 2006/0164147 A1 | 7/2006 | Nomura | |
| 2009/0002027 A1 | 1/2009 | Lee | |
| 2011/0032019 A1 | 2/2011 | Saether | |
| 2014/0145777 A1 | 5/2014 | Ma | |
| 2014/0210516 A1 | 7/2014 | Hwang | |

FOREIGN PATENT DOCUMENTS

CN 103532526 B 5/2016

* cited by examiner

*Primary Examiner* — Kenneth B Wells
(74) *Attorney, Agent, or Firm* — Winston Hsu (57) ABSTRACT

A level converting enable latch includes a level shifter circuit and a latch circuit. The level shifter circuit receives a first data input signal, and generates a first data output signal, wherein the first data input signal and the first data output signal have different voltage swings. The latch circuit sets a second data output signal in response to the first data output signal when a latch enable signal is set to a first logic value, and latches the second data output signal when the latch enable signal is set to a second logic value. The latch circuit includes a first control circuit. The first control circuit enables a latch feedback loop of the latch circuit when the latch enable signal is set to the second logic value, and disables the latch feedback loop of the latch circuit when the latch enable signal is set to the first logic value.

10 Claims, 11 Drawing Sheets

LEVEL CONVERTING ENABLE LATCH

CROSS REFERENCE TO RELATED APPLICATIONS

This application claims the benefit of U.S. provisional application No. 63/084,616, field on Sep. 29, 2020 and incorporated herein by reference.

BACKGROUND

The present invention relates to a latch design, and more particularly, to a level converting enable latch.

Latches are circuit components widely used to temporarily store data from a first logic circuit and transfer the data to a second logic circuit. In some applications, an integrated circuit (e.g., a microprocessor) may have multiple power domains such as a power down domain and an always-on (AON) domain. The power supply of the power down domain may be shut down for reducing the power consumption. In general, essential logics are required to be arranged in the AON domain. Consider a case where the first logic circuit operates in the power down domain and the second logic circuit operates in the AON domain. Data of the first logic circuit needs to be transferred to the second logic circuit before the power supply of the power down domain is shut down. Thus, there is a need for an innovative latch design which is capable of dealing with data transfer between different power domains.

SUMMARY

One of the objectives of the claimed invention is to provide a level converting enable latch.

According to a first aspect of the present invention, an exemplary level converting enable latch is disclosed. The exemplary level converting enable latch includes a level shifter circuit and a latch circuit. The level shifter circuit is arranged to receive a first data input signal, and generate and output a first data output signal, wherein a voltage swing of the first data output signal is different from a voltage swing of the first data input signal. The latch circuit is arranged to receive the first data output signal and set a second data output signal in response to the first data output signal when a latch enable signal is set to a first logic value, and latch the second data output signal when the latch enable signal is set to a second logic value that is different from the first logic value. The latch circuit comprises a first control circuit. The first control circuit is arranged to enable a latch feedback loop of the latch circuit when the latch enable signal is set to the second logic value, and disable the latch feedback loop of the latch circuit when the latch enable signal is set to the first logic value.

According to a second aspect of the present invention, an exemplary level converting enable latch is disclosed. The exemplary level converting enable latch includes a level shifter circuit and a latch circuit. The level shifter circuit is arranged to receive a first data input signal, and generate and output a first data output signal, wherein a voltage swing of the first data output signal is different from a voltage swing of the first data input signal. The latch circuit is arranged to receive the first data output signal and set a second data output signal in response to the first data output signal when a latch enable signal is set to a first logic value, and latch the second data output signal when the latch enable signal is set to a second logic value that is different from the first logic value. The level shifter circuit comprises a first transistor, a second transistor, a first footer transistor, and a second footer transistor. The first transistor has a control terminal arranged to receive the first data input signal. The second transistor has a control terminal arranged to receive a second data input signal that is an inverse of the first data input signal. The first footer transistor has a first connection terminal coupled to a first connection terminal of the first transistor and a second connection terminal coupled to a reference voltage, wherein the first footer transistor is turned on when the latch enable signal is set to the first logic value, and is turned off when the latch enable signal is set to the second logic value. The second footer transistor has a first connection terminal coupled to a first connection terminal of the second transistor and a second connection terminal coupled to the reference voltage, wherein the second footer transistor is turned on when the latch enable signal is set to the first logic value, and is turned off when the latch enable signal is set to the second logic value. A second connection terminal of the second transistor is arranged to output the first data output signal.

According to a third aspect of the present invention, an exemplary level converting enable latch is disclosed. The exemplary level converting enable latch includes a level shifter circuit and a latch circuit. The level shifter circuit is arranged to receive a first data input signal, and generate and output a first data output signal, wherein a voltage swing of the first data output signal is different from a voltage swing of the first data input signal. The latch circuit is arranged to receive the first data output signal and set a second data output signal in response to the first data output signal when a latch enable signal is set to a first logic value, and latch the second data output signal when the latch enable signal is set to a second logic value that is different from the first logic value. The level shifter circuit includes a first transistor, a second transistor, a third transistor, a fourth transistor, a fifth transistor, a sixth transistor, and a seventh transistor. The first transistor has a control terminal arranged to receive the first data input signal. The second transistor has a control terminal coupled to the control terminal of the first transistor, and a first connection terminal coupled to a connection terminal of the first transistor. The third transistor has a connection terminal arranged to output the first data output signal. The fourth transistor has a control terminal coupled to a control terminal of the third transistor, and a first connection terminal coupled to the connection terminal of the third transistor. The fifth transistor has a control terminal coupled to the connection terminal of the third transistor, a first connection terminal coupled to a second connection terminal of the second transistor, and a second connection terminal coupled to a reference voltage. The sixth transistor has a control terminal coupled to the connection terminal of the first transistor, a first connection terminal coupled to a second connection terminal of the fourth transistor, and a second connection terminal coupled to the reference voltage. The seventh transistor has a first connection terminal coupled to the second connection terminal of the fourth transistor, and a second connection terminal coupled to the reference voltage, wherein the seventh transistor is turned off when the latch enable signal is set to the first logic value, and is turned on when the latch enable signal is set to the second logic value. The latch circuit includes a multiplexer. The multiplexer has a first input node arranged to receive an internal signal of the latch circuit, a second input node arranged to receive a second data input signal that is an inverse of the first data input signal, and an output node arranged to output a multiplexer output signal to both of the control terminal of the third transistor and the control terminal of the fourth transistor, wherein the multiplexer selects the internal signal as the multiplexer output signal when the latch enable signal is set to the second logic value, and selects the second data input signal as the multiplexer output signal when the latch enable signal is set to the first logic value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
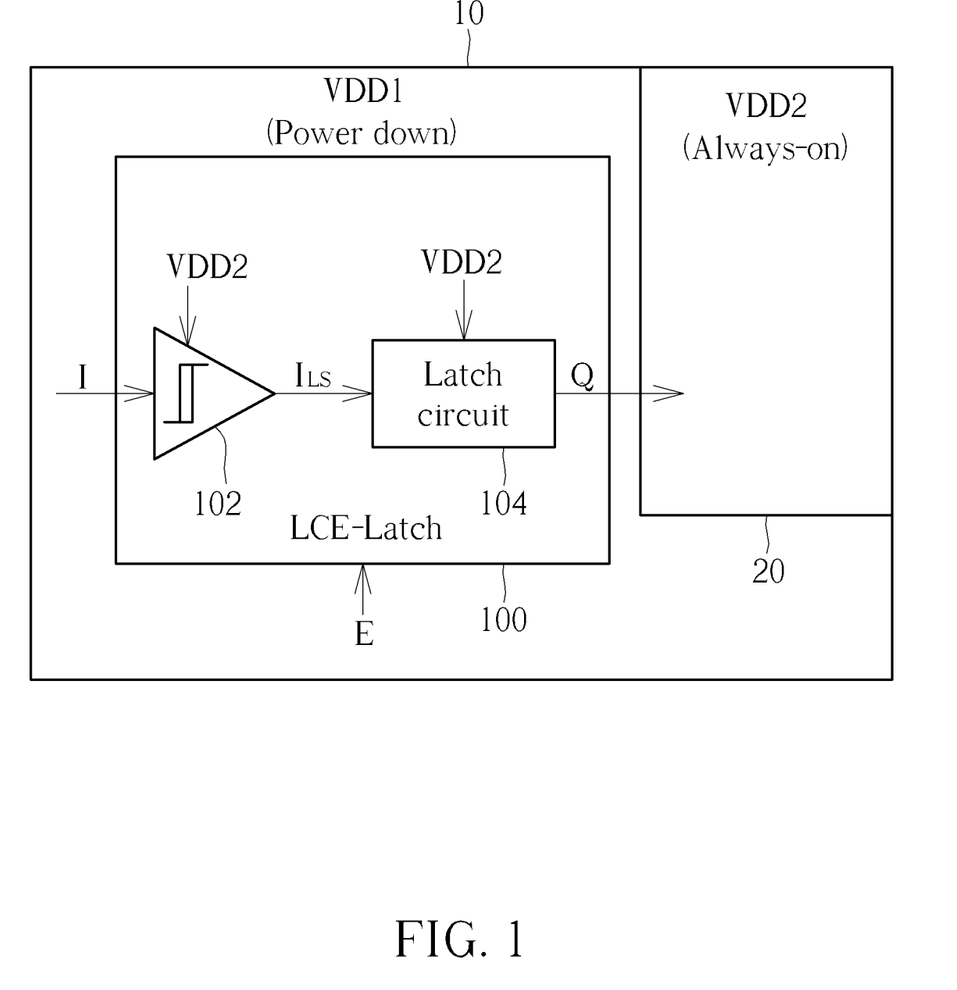
FIG. 1 is a diagram illustrating basic architecture of a proposed level converting enable latch according to an embodiment of the present invention.

FIG. 1 is a diagram illustrating basic architecture of a proposed level converting enable latch according to an embodiment of the present invention. The level converting enable latch (labeled as "LCE_Latch") 100 includes a level shifter circuit 102 and a latch circuit 104. It should be noted that the level converting enable latch 100 may include additional circuit components, depending upon actual design considerations. The level converting enable latch 100 receives a data input signal I from a logic circuit in a first power domain such as a power down domain 10 with a power supply voltage VDD1, and generates a data output signal Q to a logic circuit in a second power domain such as an always-on domain 20 with a power supply voltage VDD2. For example, the level shifter circuit 102 is powered by the power supply voltage VDD2, and arranged to receive the data input signal I from the logic circuit in the power down domain 10, and generate the data output signal $I_{LS}$ according to the data input signal I. Specifically, the level shifter circuit 102 is arranged to convert the voltage difference between the power supply voltages VDD1 and VDD2, such that the data input signal I of the level shifter circuit 102 has a voltage swing of (VDD1-VSS), and the data output signal $I_{LS}$ of the level shifter circuit 102 has a voltage swing of (VDD2-VSS), where VSS is a ground voltage. The latch circuit 104 is powered by the power supply voltage VDD2. The latch circuit 104 is arranged to receive the data output signal $I_{LS}$ from the level shifter circuit 102 and set the data output signal Q in response to the received data output signal $I_{LS}$ when a latch enable signal E is set to a first logic value, and is further arranged to latch the data output signal Q when the latch enable signal E is set to a second logic value that is different from the first logic value. In other words, when the latch enable signal E is set to the first logic value, the data output signal Q is allowed to vary with the data input signal I, and when the latch enable signal E is set to the second logic value, the data output signal Q holds a logic value that is obtained from the data input signal I at the time the latch enable signal E has a transition from the first logic value to the second value.

In some embodiments, the latch circuit 104 may have a latch feedback loop that can be selectively enabled or disabled under the control of the latch enable signal E. In some embodiments, footer transistors of the level shifter circuit 102 may be reused to disable a cross-coupled function, where the footer transistors are originally implemented for electrostatic discharge (ESD) protection. Since the footer transistors of the level shifter circuit 102 are reused, the transistor count of the level converting enable latch 100 can be reduced, thereby making the level converting enable latch 100 have lower dynamic power. In some embodiments, a quasi-inverter of the level shifter circuit 102 may be reused as a latch feedback inverter. Since the quasi-inverter of the level shifter circuit 102 is reused, the transistor count of the level converting enable latch 100 can be reduced, thereby making the level converting enable latch 100 have lower dynamic power. In addition, since the quasi-inverter of the level shifter circuit 102 is reused as a latch feedback inverter located at a leakage path between VDD2 and VSS, the latch leakage power under a VDD1 power down scenario can be reduced. Further details of the proposed level converting enable latch 100 are described with reference to the accompanying drawings.

Figure 2:
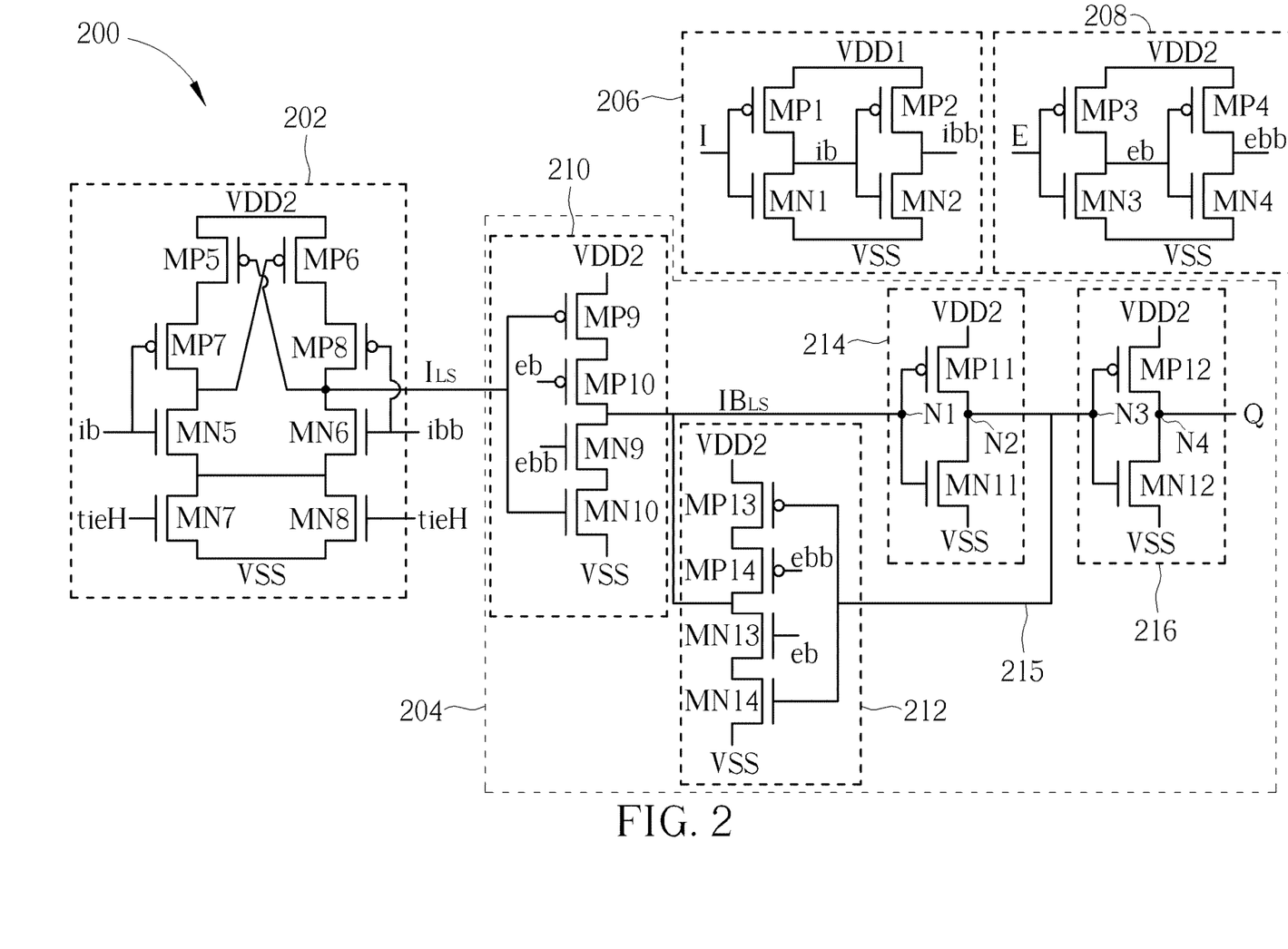
FIG. 2 is a circuit diagram of a first level converting enable latch design according to an embodiment of the present invention.

FIG. 2 is a circuit diagram of a first level converting enable latch design according to an embodiment of the present invention. The level converting enable latch 200 follows the architecture shown in FIG. 1, and includes a level shifter circuit 202 and a latch circuit 204. In addition, the level converting enable latch 200 may further include signal generation circuits 206 and 208 that act as buffers for providing cleaner data input signal(s) and cleaner latch enable signal(s). The signal generation circuit 206 operates according to different reference voltages including a power supply voltage VDD1 and a ground voltage VSS, and has a plurality of P-channel metal-oxide semiconductor (PMOS) transistors MP1, MP2 and a plurality of N-channel metal-oxide semiconductor (NMOS) transistors MN1, MN2. In this embodiment, the signal generation circuit 206 includes one inverter consisting of PMOS transistor MP1 and NMOS transistor MN1, and another inverter consisting of PMOS transistor MP2 and NMOS transistor MN2. Hence, the signal generation circuit 206 generates a data input signal ib according to a data input signal I that may be provided by a logic circuit in a power domain (e.g., power down domain) with the power supply voltage VDD1, and further generates a data input signal ibb according to the data input signal ib, where the data input signal ib is an inverse of the data input signal I (i.e., ib=$\bar{I}$), and the data input signal ibb is an inverse of the data input signal ib (i.e., ibb=$\bar{ib}$=I). Alternatively, the signal generation circuit 206 may be modified to omit PMOS transistor MP2 and NMOS transistor MN2, such that the data input signal I and an inverse of the data input signal I (i.e., data input signal ib) may be used by the level shifter circuit 202.

The signal generation circuit 208 operates according to different reference voltages including a power supply voltage VDD2 (VDD2≠VDD1) of another power domain (e.g., always-on domain) and the ground voltage VSS, and has a plurality of PMOS transistors MP3, MP4 and a plurality of NMOS transistors MN3, MN4. In this embodiment, the signal generation circuit 208 includes one inverter consisting of PMOS transistor MP3 and NMOS transistor MN3, and another inverter consisting of PMOS transistor MP4 and NMOS transistor MN4. Hence, the signal generation circuit 208 generates a latch enable signal eb according to a latch enable signal E, and generates a latch enable signal ebb according to the latch enable signal eb, where the latch enable signal eb is an inverse of the latch enable signal E (i.e., eb=$\bar{E}$), and the latch enable signal ebb is an inverse of the latch enable signal eb (i.e., ebb=$\bar{eb}$=E). Alternatively, the signal generation circuit 208 may be modified to omit PMOS transistor MP4 and NMOS transistor MN4, such that the latch enable signal E and an inverse of the latch enable signal (i.e., latch enable signal eb) may be used by the latch circuit 204.

The level shifter circuit 202 is arranged to receive the data input signal ibb, and generate and output a data output signal $I_{LS}$. In this embodiment, the data output signal $I_{LS}$ may be regarded as a level-shifting version of an inverse of the data input signal ibb, that is, a level-shifting version of the data input signal ib. Specifically, the data input signal ibb of the level shifter circuit 202 has a voltage swing of (VDD1-VSS), while the data output signal $I_{LS}$ of the level shifter circuit 202 has a voltage swing of (VDD2-VSS). In this embodiment, the level shifter circuit 202 employs cross-coupled level shifter architecture, and therefore can support both VDD1>VDD2 and VDD1<VDD2. As shown in FIG. 2, the level shifter circuit 202 includes PMOS transistors MP5, MP6, MP7, MP8 and NMOS transistors MN5, MN6, and further includes optional NMOS transistors MN7, MN8 that act as footer transistors for ESD protection.

Each of the PMOS transistors and NMOS transistors has a control terminal (e.g., gate terminal) and two connection terminals (e.g., source terminal and drain terminal). In accordance with the cross-coupled architecture, the PMOS transistor MP5 has a source terminal coupled to the power supply voltage VDD2, a drain terminal coupled to a source terminal of the PMOS transistor MP7, and a gate terminal coupled to a drain terminal of the NMOS transistor MN6; and the PMOS transistor MP6 has a source terminal coupled to the power supply voltage VDD2, a drain terminal coupled to a source terminal of the PMOS transistor MP8, and a gate terminal coupled to a drain terminal of the NMOS transistor MN5. In addition, the PMOS transistor MP7 has a drain terminal coupled to the drain terminal of the NMOS transistor MN5 and a gate terminal coupled to a gate terminal of the NMOS transistor MN5, the PMOS transistor MP8 has a drain terminal coupled to the drain terminal of the NMOS transistor MN6 and a gate terminal coupled to a gate terminal of the NMOS transistor MN6, the NMOS transistor MN5 has the gate terminal arranged to receive the data input signal ib (ib=$\bar{I}$), the NMOS transistor MN6 has the gate terminal arranged to receive the data input signal ibb (ibb=I), and a source terminal of the NMOS transistor MN5 is coupled to a source terminal of the NMOS transistor MN6.

The NMOS transistors MN7 and MN8 act as footer transistors for ESD protection. The NMOS transistor MN7 has a drain terminal coupled to the source terminal of the NMOS transistor MN5, a source terminal coupled to the ground voltage VSS, and a gate terminal arranged to receive a high bias voltage tieH, where the NMOS transistor MN7 is turned on by the high bias voltage tieH under a normal mode. The NMOS transistor MN8 has a drain terminal coupled to the source terminal of the NMOS transistor MN6, a source terminal coupled to the ground voltage VSS, and a gate terminal arranged to receive the high bias voltage tieH, where the NMOS transistor MN8 is turned on by the high bias voltage tieH under a normal mode.

Figure 3:
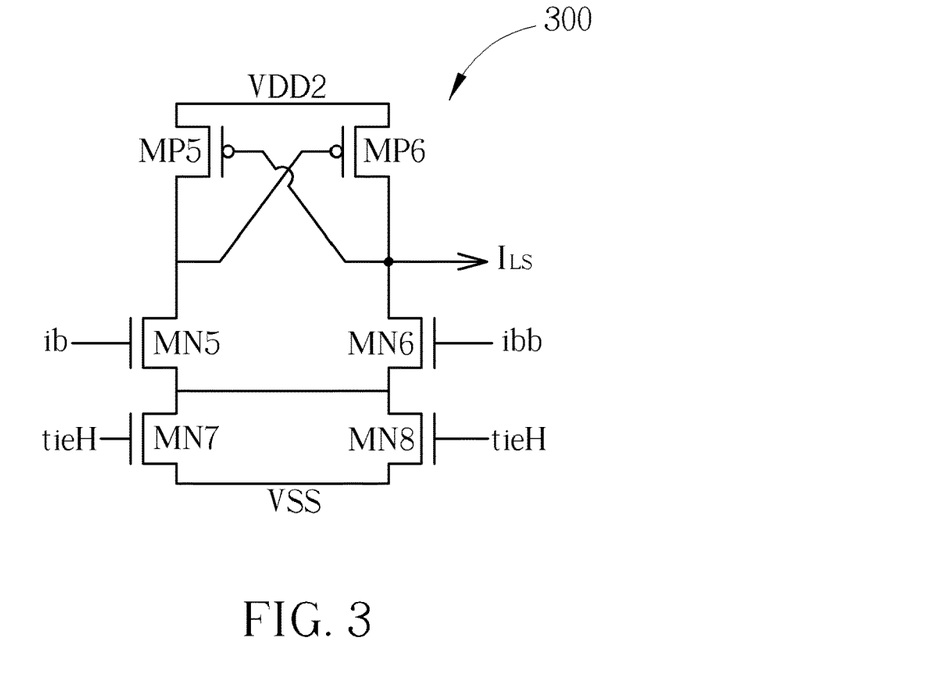
FIG. 3 is a diagram illustrating an alternative design of a level shifter circuit used by the level converting enable latch shown in FIG. 2 according to an embodiment of the present invention.

The circuit design of the level shifter circuit 202 shown in FIG. 2 is for illustrative purposes only, and is not meant to be a limitation of the present invention. In some embodiments, the level shifter circuit 202 may be modified to employ another cross-coupled level shifter architecture. FIG. 3 is a diagram illustrating an alternative design of the level shifter circuit 202 used by the level converting enable latch 200 shown in FIG. 2 according to an embodiment of the present invention. The level shifter circuit 202 shown in FIG. 2 may be replaced with the level shifter circuit 300 shown in FIG. 3. The major difference between the level shifter circuits 202 and 300 is that the level shifter circuit 300 does not have PMOS transistors MP7 and MP8 included in the level shifter circuit 202.

As mentioned above, the NMOS transistors MN7 and MN8 act as footer transistors for ESD protection. In some embodiments, the level shifter circuit 202/300 may be modified to omit the NMOS transistors MN7 and MN8 and directly connect source terminals of the NMOS transistors MN5 and MN6 to the ground voltage VSS.

The data output signal $I_{LS}$ is a level-shifting version of an inverse of the data input signal ibb. The latch circuit 204 is arranged to receive the data output signal $I_{LS}$ and set the data output signal Q in response to the data output signal $I_{LS}$ when the latch enable signal E is set to one logic value 1, and latch the data output signal Q when the latch enable signal E is set to another logic value 0. After the data output signal $I_{LS}$ is latched by the latch circuit 204, the power supply voltage VDD1 may be shut down for power saving. As shown in FIG. 2, the latch circuit 204 includes a plurality of control circuits 210, 212 and a plurality of inverters 214, 216.

The control circuit 210 includes a plurality of PMOS transistors MP9, MP10 and a plurality of NMOS transistors MN9, MN10. The PMOS transistor MP9 has a source terminal coupled to the power supply voltage VDD2, a gate terminal arranged to receive the data output signal $I_{LS}$, and a drain terminal coupled to a source terminal of the PMOS transistor MP10. The PMOS transistor MP10 has a gate terminal arranged to receive the latch enable signal eb and a drain terminal coupled to a drain terminal of the NMOS transistor MN9. The NMOS transistor MN9 has a gate terminal arranged to receive the latch enable signal ebb and a source terminal coupled to a drain terminal of the NMOS transistor MN10. The NMOS transistor MN10 has a gate terminal arranged to receive the data output signal $I_{LS}$ and a source terminal coupled to the ground voltage VSS.

When the latch enable signal E is set to the logic value 1, the latch enable signal eb has the logic value 0, and the latch enable signal ebb has the logic value 1. Hence, the control circuit 210 has PMOS transistor MP10 and NMOS transistor MN9 both being turned on, and has an inverter (which consists of PMOS transistor MP9 and NMOS transistor MN9) that is active to invert the data output signal $I_{LS}$ to generate a data output signal $IB_{LS}$ at drain terminals of PMOS transistor MP10 and NMOS transistor MN9, where the data output signal $IB_{LS}$ is an inverse of the data output signal $I_{LS}$. In other words, when the latch enable signal E is set to the logic value 1, the control circuit 210 allows the data output signal HU to be derived from the data output signal $I_{LS}$.

When the latch enable signal E is set to the logic value 0, the latch enable signal eb has the logic value 1, and the latch enable signal ebb has the logic value 0. Hence, the control circuit 210 is disabled due to PMOS transistor MP10 and NMOS transistor MN9 both being turned off. In other words, when the latch enable signal E is set to the logic value 0, the control circuit 210 blocks the data output signal $IB_{LS}$ from being derived from the data output signal $I_{LS}$.

The data output signal Q is set in response to the data output signal $IB_{LS}$ through inverters 214 and 216. The inverter 214 consists of PMOS transistor MP11 and NMOS transistor MN11, and has an input node N1 arranged to receive the data output signal $IB_{LS}$. The inverter 216 consists of PMOS transistor MP12 and NMOS transistor MN12, and has an input node N3 coupled to an output node N2 of the inverter 214 and an output node N4 arranged to output the data output signal Q.

The control circuit 212 includes a plurality of PMOS transistors MP13, MP14 and a plurality of NMOS transistors MN13, MN14. The PMOS transistor MP13 has a source terminal coupled to the power supply voltage VDD2, a gate terminal coupled to the output node N2 of the inverter 214, and a drain terminal coupled to a source terminal of the PMOS transistor MP14. The PMOS transistor MP14 has a gate terminal arranged to receive the latch enable signal ebb, and a drain terminal coupled to a drain terminal of the NMOS transistor MN13. The NMOS transistor MN13 has a gate terminal arranged to receive the latch enable signal eb, and a source terminal coupled to a drain terminal of the NMOS transistor MN14. The NMOS transistor MN14 has a gate terminal coupled to the output node N2 of the inverter 214, and a source terminal coupled to the ground voltage VSS.

When the latch enable signal E is set to the logic value 0, the latch enable signal eb has the logic value 1, and the latch enable signal ebb has the logic value 0. Hence, the control circuit 212 disables a latch feedback loop 215 due to PMOS transistor MP14 and NMOS transistor MN13 both being turned off. When the latch enable signal E is set to the logic value 1, the latch enable signal eb has the logic value 0, and the latch enable signal ebb has the logic value 1. Hence, the control circuit 212 enables the latch feedback loop 215 due to PMOS transistor MP14 and NMOS transistor MN13 both being turned on, and also has an inverter (which consists of PMOS transistor MP13 and NMOS transistor MN14) that is active for inverting an output signal of the inverter 214 to set an input signal (i.e., data output signal $IB_{LS}$) of the inverter 214.

In this embodiment, the latch circuit 204 is a high-enable type latch. When E=ebb=1 and eb=0, the latch feedback loop 215 is cut off and the control circuit 210 sets an input signal of the inverter 214 by inverting the data output signal $I_{LS}$ (which is an output of the level shifter circuit 202), such that the data output signal Q is set in response to the data output signal $I_{LS}$ through the control circuit 210 and the inverters 214 and 216. When E=ebb=0 and eb=1, the control circuit 210 blocks an input signal of the inverter 214 from being affected by the level shifter circuit 202, and the latch feedback loop 215 is enabled, such that the data output signal Q is latched through the control circuit 212 and the inverters 214 and 216.

Figure 4:
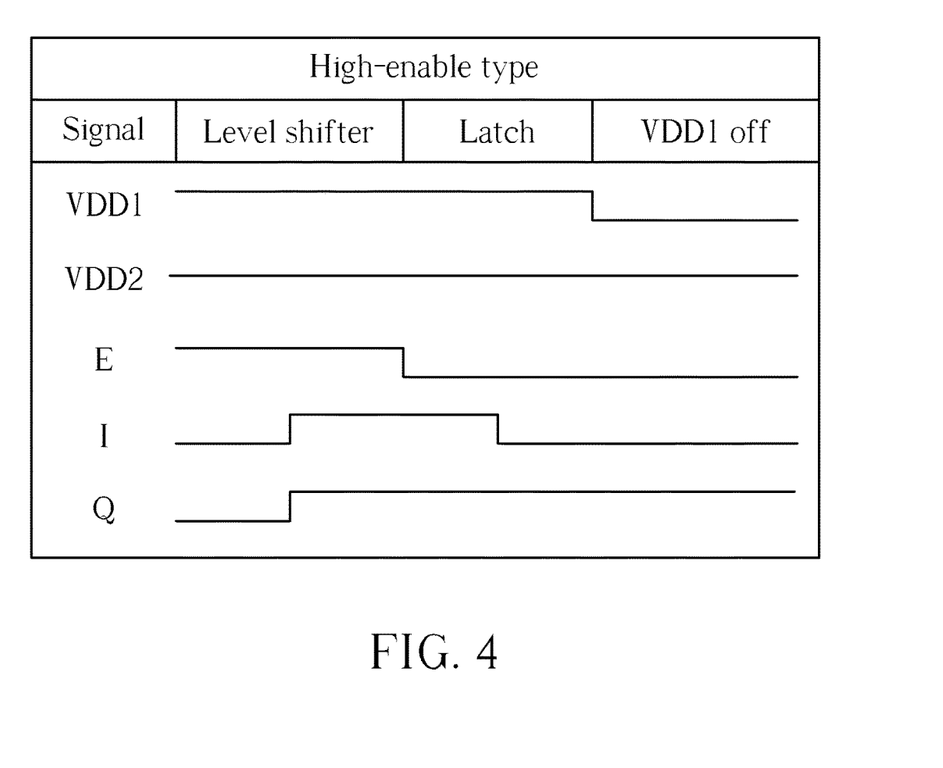
FIG. 4 is a diagram illustrating an operation scenario of a high-enable type latch according to an embodiment of the present invention.

FIG. 4 is a diagram illustrating an operation scenario of a high-enable type latch according to an embodiment of the present invention. During a period in which the latch enable signal E is set to the logic value 1, the data output signal Q is set in response to the data input signal I. During a period in which the latch enable signal E is set to the logic value 0, the data output signal Q is latched, regardless of the data input signal I. Since the data output signal Q is latched, the power supply VDD1 of the power down domain can be shut down for power saving.

Figure 5:
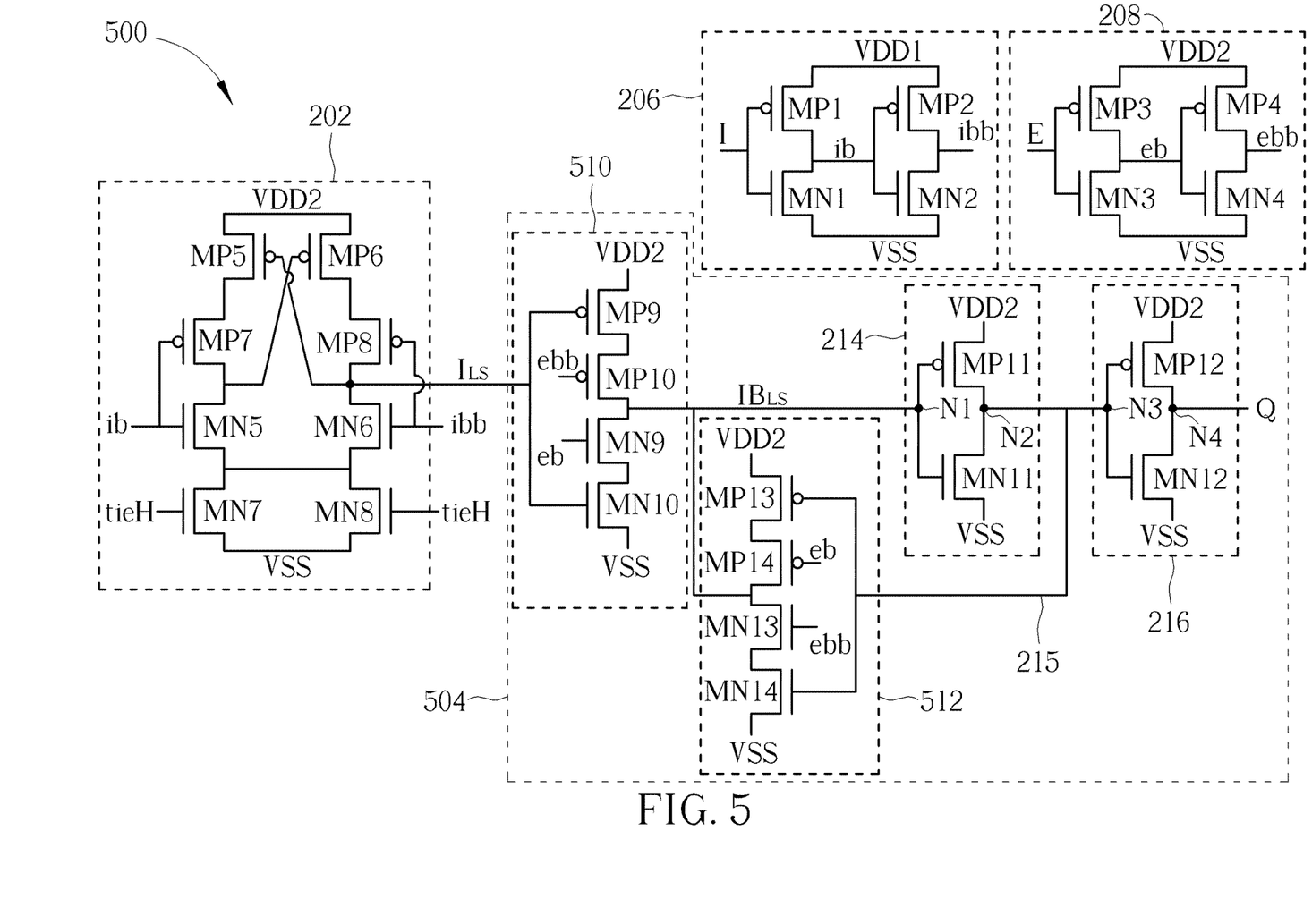
FIG. 5 is a circuit diagram of a second level converting enable latch design according to an embodiment of the present invention.

FIG. 5 is a circuit diagram of a second level converting enable latch design according to an embodiment of the present invention. The level converting enable latch 500 follows the architecture shown in FIG. 1. The major difference between the level converting enable latches 500 and 200 is that a PMOS transistor MP10 of a control circuit 510 in a latch circuit 504 has a gate terminal arranged to receive the latch enable signal ebb, an NMOS transistor MN9 of the control circuit 510 in the latch circuit 504 has a gate terminal arranged to receive the latch enable signal eb, a PMOS transistor MP14 of a control circuit 512 in the latch circuit 504 has a gate terminal arranged to receive the latch enable signal eb, and an NMOS transistor MN13 of the control circuit 512 in the latch circuit 504 has a gate terminal arranged to receive the latch enable signal ebb.

In this embodiment, the latch circuit 504 is a low-enable type latch. When E=ebb=0 and eb=1, the latch feedback loop 215 is cut off and the control circuit 510 sets an input signal of the inverter 214 by inverting the data output signal $I_{LS}$ (which is an output of the level shifter circuit 202), such that the data output signal Q is set in response to the data output signal $I_{LS}$ through the control circuit 510 and the inverters 214 and 216. When E=ebb=1 and eb=0, the control circuit 510 blocks an input signal of the inverter 214 from being affected by the level shifter circuit 202, and the latch feedback loop 215 is enabled, such that the data output signal Q is latched through the control circuit 512 and the inverters 214 and 216.

Figure 6:
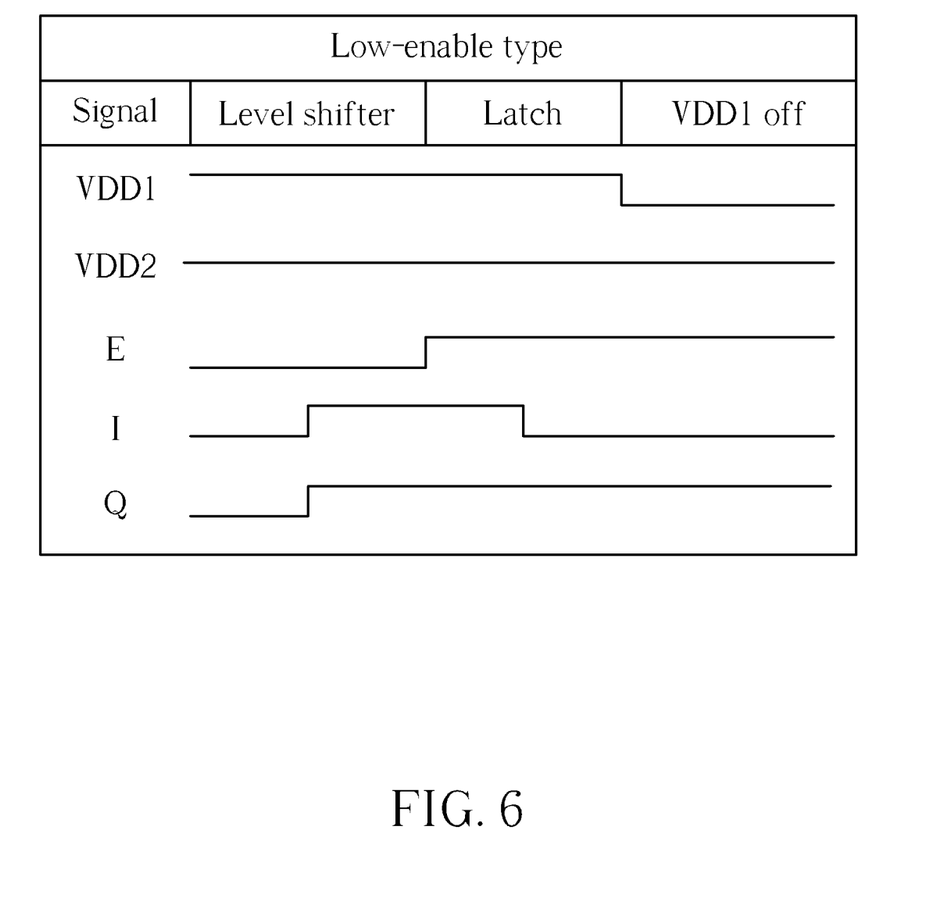
FIG. 6 is a diagram illustrating an operation scenario of a low-enable type latch according to an embodiment of the present invention.

FIG. 6 is a diagram illustrating an operation scenario of a low-enable type latch according to an embodiment of the present invention. During a period in which the latch enable signal E is set to the logic value 0, the data output signal Q is set in response to the data input signal I. During a period in which the latch enable signal E is set to the logic value 1, the data output signal Q is latched, regardless of the data input signal I. Since the data output signal Q is latched, the power supply VDD1 of the power down domain can be shut down for power saving.

Figure 7:
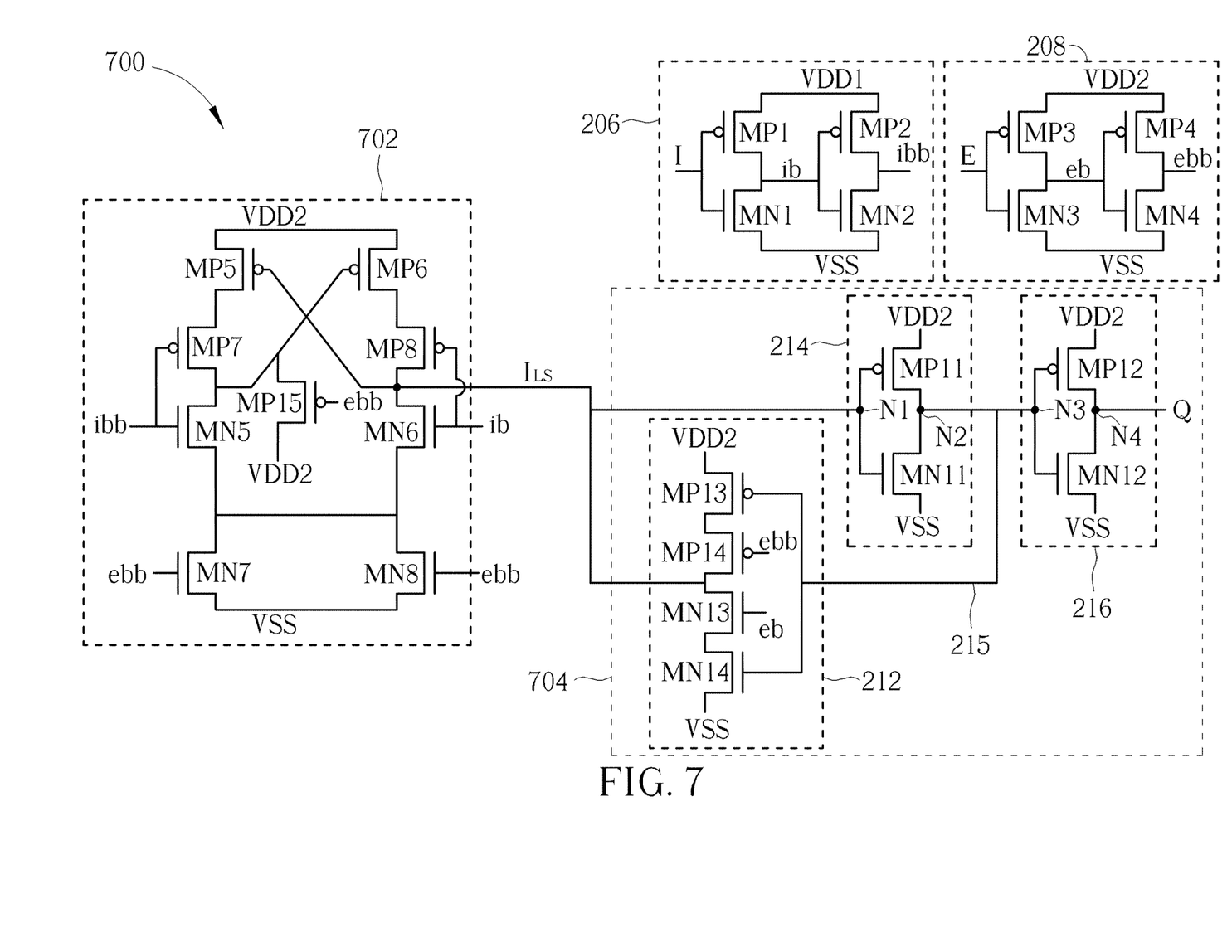
FIG. 7 is a circuit diagram of a third level converting enable latch design according to an embodiment of the present invention.

FIG. 7 is a circuit diagram of a third level converting enable latch design according to an embodiment of the present invention. The level converting enable latch 700 follows the architecture shown in FIG. 1, and includes a level shifter circuit 702 and a latch circuit 704. In addition, the level converting enable latch 700 may further include the aforementioned signal generation circuits 206 and 208 that act as buffers for providing cleaner data input signal(s) and cleaner latch enable signal(s). However, this is not meant to be a limitation of the present invention. Alternatively, the signal generation circuit 206 may be modified to omit PMOS transistor MP2 and NMOS transistor MN2, such that the data input signal I and an inverse of the data input signal I (i.e., data input signal ib) may be used by the level shifter circuit 702. Similarly, the signal generation circuit 208 may be modified to omit PMOS transistor MP4 and NMOS transistor MN4, such that the latch enable signal E and an inverse of the latch enable signal (i.e., latch enable signal eb) may be used by the latch circuit 704, and the latch enable signal E may be used by the level shifter circuit 702.

The level shifter circuit 702 is arranged to receive the data input signal ibb, and generate and output the data output signal $I_{LS}$. In this embodiment, the data output signal $I_{LS}$ may be regarded as a level-shifting version of the data input signal ibb. Specifically, the data input signal ibb of the level shifter circuit 702 has a voltage swing of (VDD1-VSS), while the data output signal $I_{LS}$ of the level shifter circuit 702 has a voltage swing of (VDD2-VSS). In this embodiment, the level shifter circuit 702 employs cross-coupled level shifter architecture, and therefore can support both VDD1>VDD2 and VDD1<VDD2. As shown in FIG. 7, the level shifter circuit 702 includes PMOS transistors MP5, MP6, MP7, MP8, MP15, and NMOS transistors MN5, MN6, MN7, MN8, where the NMOS transistors MN7 and MN8 can act as footer transistors for ESD protection. The major difference between the level shifter circuits 702 and 202 is that the data input signal ibb is received by gate terminals of PMOS transistor MP7 and NMOS transistor MN5, the data input signal ib is received by gate terminals of PMOS transistor MP8 and NMOS transistor MN6, the latch enable signal ebb is received by gate terminals of NMOS transistors MN7, MN8, and the additional PMOS transistor MP15 has a source terminal coupled to the power supply voltage VDD2, a drain terminal coupled to the drain terminal of the NMOS transistor MN5, and a gate terminal arranged to receive the latch enable signal ebb.

When the latch enable signal E is set to the logic value 1, the latch enable signal ebb has the logic value 1. Hence, the PMOS transistor MP15 is turned off and the NMOS transistors MN7 and MN8 are turned on, thus allowing the level shifter circuit 702 to work normally for applying level-shifting to the data input signal ibb to set the data output signal $I_{LS}$. However, when the latch enable signal E is set to the logic value 0, the latch enable signal ebb has the logic value 0. Hence, the NMOS transistors MN7 and MN8 are turned off, thus disabling a designated level-shifting function of the level shifter circuit 702. Furthermore, to prevent leakage caused by an unknown state of the level shifter circuit 702 under a condition that the NMOS transistors MN7 and MN8 are turned off, the PMOS transistor MP15 is turned on for coupling the power supply voltage VDD2 to one cross-coupled path. In other words, the PMOS transistor MP15 is controlled by the latch enable signal ebb for leakage reduction.

More specifically, the NMOS transistors MN7 and MN8 (which originally act as footer transistors for ESD protection) can be reused to take the place of the control circuit 210 shown in FIG. 2. Hence, the latch circuit 704 may be obtained by removing the control circuit 210 from the latch circuit 204, such that the data output signal $I_{LS}$ output from the level shifter circuit 702 is received by the input node N1 of the inverter 214 when the latch feedback loop 215 is disabled by the control circuit 212, and is set by inverting an output signal of the inverter 214 when the latch feedback loop 215 is enabled by the control circuit 212. Specifically, when the latch enable signal E is set to the logic value 1, the latch enable signal eb has the logic value 0, and the latch enable signal ebb has the logic value 1. Hence, the control circuit 212 disables the latch feedback loop 215 due to PMOS transistor MP14 and NMOS transistor MN13 both being turned off. When the latch enable signal E is set to the logic value 0, the latch enable signal eb has the logic value 1, and the latch enable signal ebb has the logic value 0. Hence, the control circuit 212 enables the latch feedback loop 215 due to PMOS transistor MP14 and NMOS transistor MN13 both being turned on, and has an inverter (which consists of PMOS transistor MP13 and NMOS transistor MN14) that is active for inverting the output signal of the inverter 214 to set an input signal (i.e., data output signal $I_{LS}$) of the inverter 214.

Figure 8:
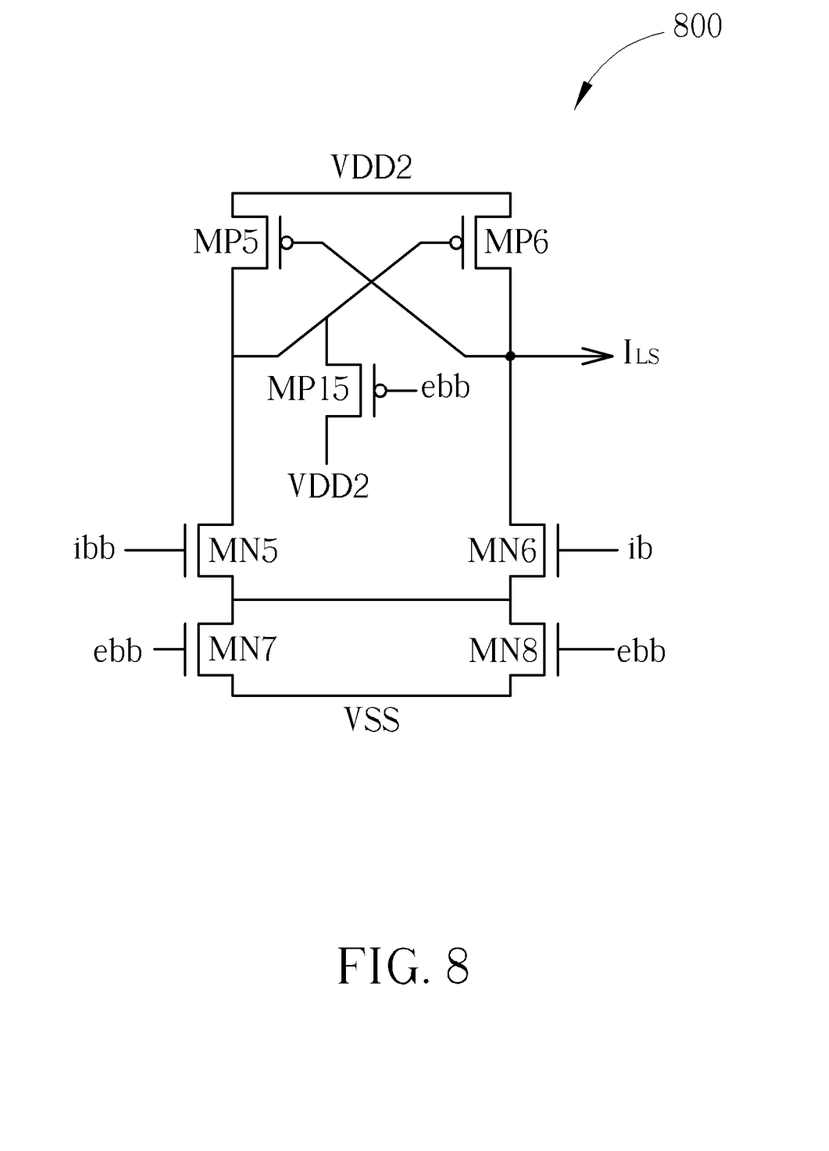
FIG. 8 is a diagram illustrating an alternative design of a level shifter circuit used by the level converting enable latch shown in FIG. 7 according to an embodiment of the present invention.

The circuit design of the level shifter circuit 702 shown in FIG. 7 is for illustrative purposes only, and is not meant to be a limitation of the present invention. In some embodiments, the level shifter circuit 702 may be modified to employ another cross-coupled level shifter architecture. FIG. 8 is a diagram illustrating an alternative design of the level shifter circuit 702 used by the level converting enable latch 700 shown in FIG. 7 according to an embodiment of the present invention. The level shifter circuit 702 shown in FIG. 7 may be replaced with the level shifter circuit 800 shown in FIG. 8. The major difference between the level shifter circuits 702 and 800 is that the level shifter circuit 800 does not have the PMOS transistors MP7 and MP8 included in the level shifter circuit 702.

In this embodiment, the latch circuit 704 is a high-enable type latch. When E=ebb=1 and eb=0, the latch feedback loop 215 is cut off and the footer transistors MN7, MN9 are turned on, such that the level shifter circuit 702 works normally to generate and output the data output signal $I_{LS}$, and the data output signal Q is set in response to the data output signal $I_{LS}$ through the inverters 214 and 216. When E=ebb=0 and eb=1, the footer transistors MN7 and MN8 are turned off to disable the cross-coupled function, and the latch feedback loop 215 is enabled, such that the data output signal Q is latched through the control circuit 212 and the inverters 214 and 216.

As illustrated in FIG. 4, during a period in which the latch enable signal E is set to the logic value 1, the data output signal Q is set in response to the data input signal I; and during a period in which the latch enable signal E is set to the logic value 0, the data output signal Q is latched, regardless of the data input signal I. Since the data output signal Q is latched, the power supply VDD1 of the power down domain can be shut down for power saving.

Figure 9:
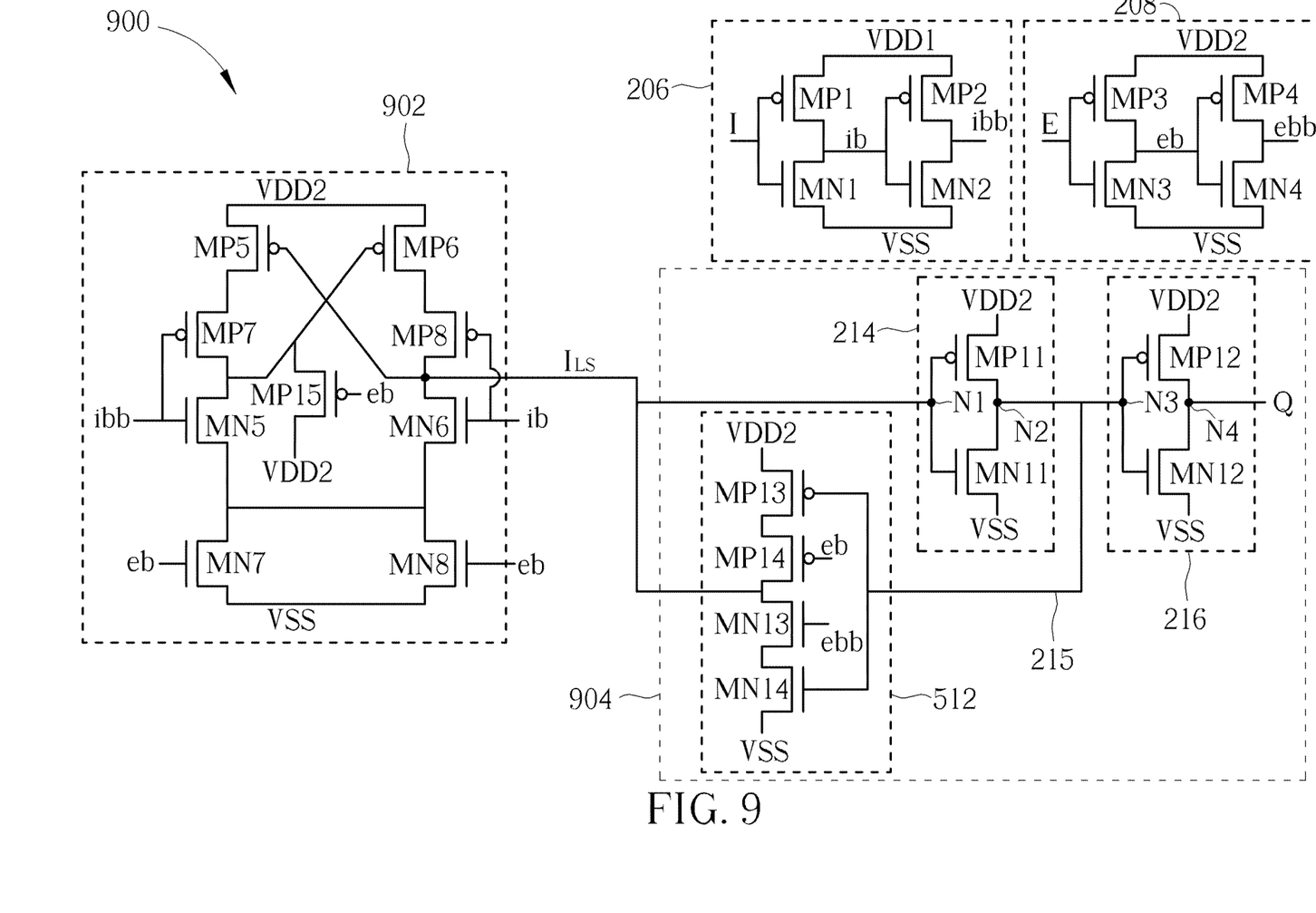
FIG. 9 is a circuit diagram of a fourth level converting enable latch design according to an embodiment of the present invention.

FIG. 9 is a circuit diagram of a fourth level converting enable latch design according to an embodiment of the present invention. The level converting enable latch 900 follows the architecture shown in FIG. 1. The major difference between the level converting enable latches 900 and 700 is that the latch enable signal eb is received by gate terminals of NMOS transistors MN7 and MN8 and PMOS transistor MP15 in a level shifter circuit 902, a PMOS transistor MP14 of the control circuit 512 used by a latch circuit 904 has a gate terminal arranged to receive the latch enable signal eb, and an NMOS transistor MN13 of the control circuit 512 used by the latch circuit 904 has a gate terminal arranged to receive the latch enable signal ebb.

Figure 10:
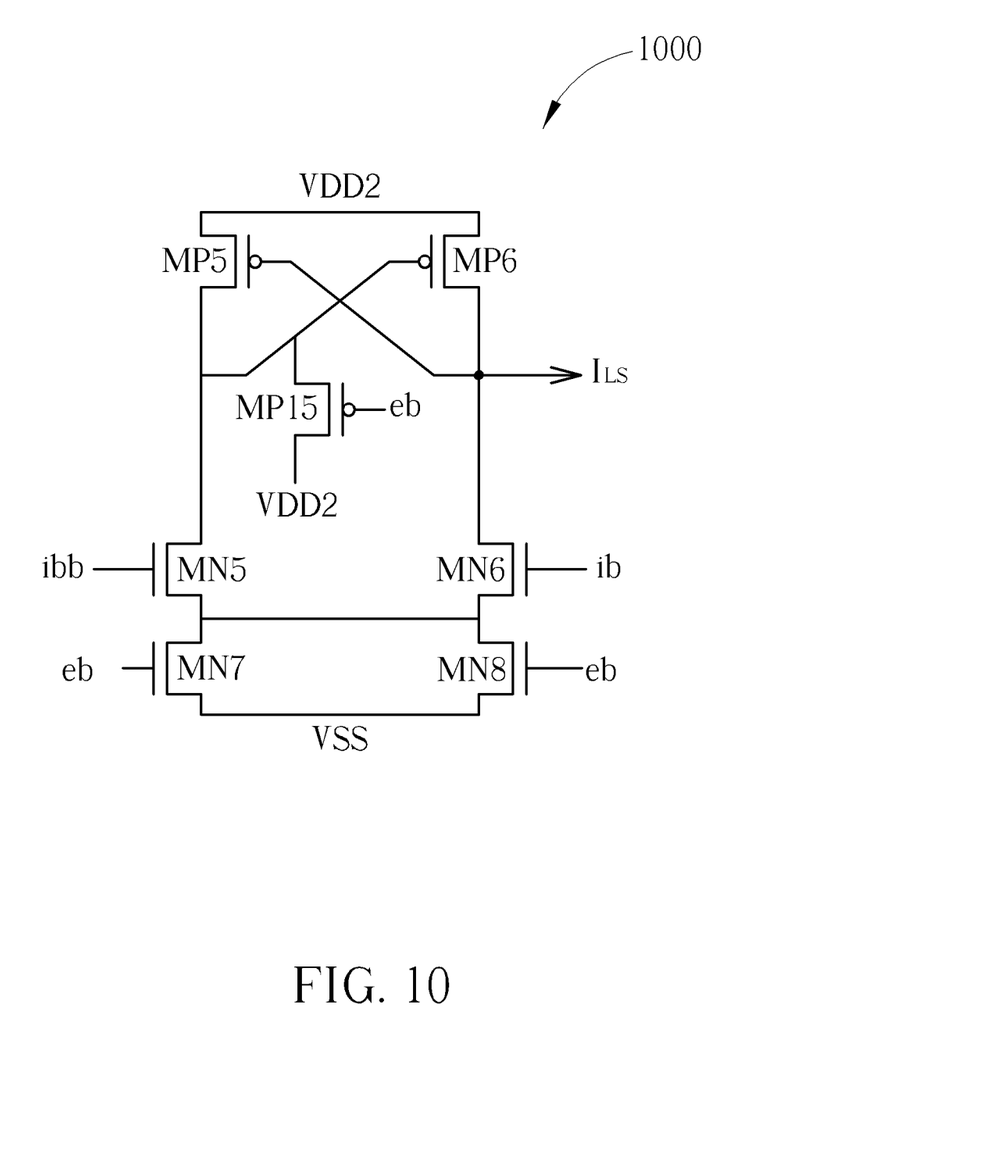
FIG. 10 is a diagram illustrating an alternative design of a level shifter circuit in the level converting enable latch shown in FIG. 9 according to an embodiment of the present invention.

The circuit design of the level shifter circuit 902 shown in FIG. 9 is for illustrative purposes only, and is not meant to be a limitation of the present invention. In some embodiments, the level shifter circuit 902 may be modified to employ another cross-coupled level shifter architecture. FIG. 10 is a diagram illustrating an alternative design of the level shifter circuit 902 in the level converting enable latch 900 shown in FIG. 9 according to an embodiment of the present invention. The level shifter circuit 902 shown in FIG. 9 may be replaced with the level shifter circuit 1000 shown in FIG. 10. The major difference between the level shifter circuits 902 and 1000 is that the level shifter circuit 1000 does not have the PMOS transistors MP7 and MP8 included in the level shifter circuit 902.

In this embodiment, the latch circuit 904 is a low-enable type latch. When E=ebb=0 and eb=1, the latch feedback loop 215 is cut off and the footer transistors MN7, MN9 are turned on, such that the level shifter circuit 902 works normally to generate and output the data output signal $I_{LS}$, and the data output signal Q is set in response to the data output signal $I_{LS}$ through the inverters 214 and 216. When E=ebb=1 and eb=0, the footer transistors MN7 and MN8 are turned off to disable the cross-coupled function, and the latch feedback loop 215 is enabled, such that the data output signal Q is latched through the control circuit 512 and the inverters 214 and 216.

As illustrated in FIG. 6, during a period in which the latch enable signal E is set to the logic value 0, the data output signal Q is set in response to the data input signal I; and during a period in which the latch enable signal E is set to the logic value 1, the data output signal Q is latched, regardless of the data input signal I. Since the data output signal Q is latched, the power supply VDD1 of the power down domain can be shut down for power saving.

Figure 11:
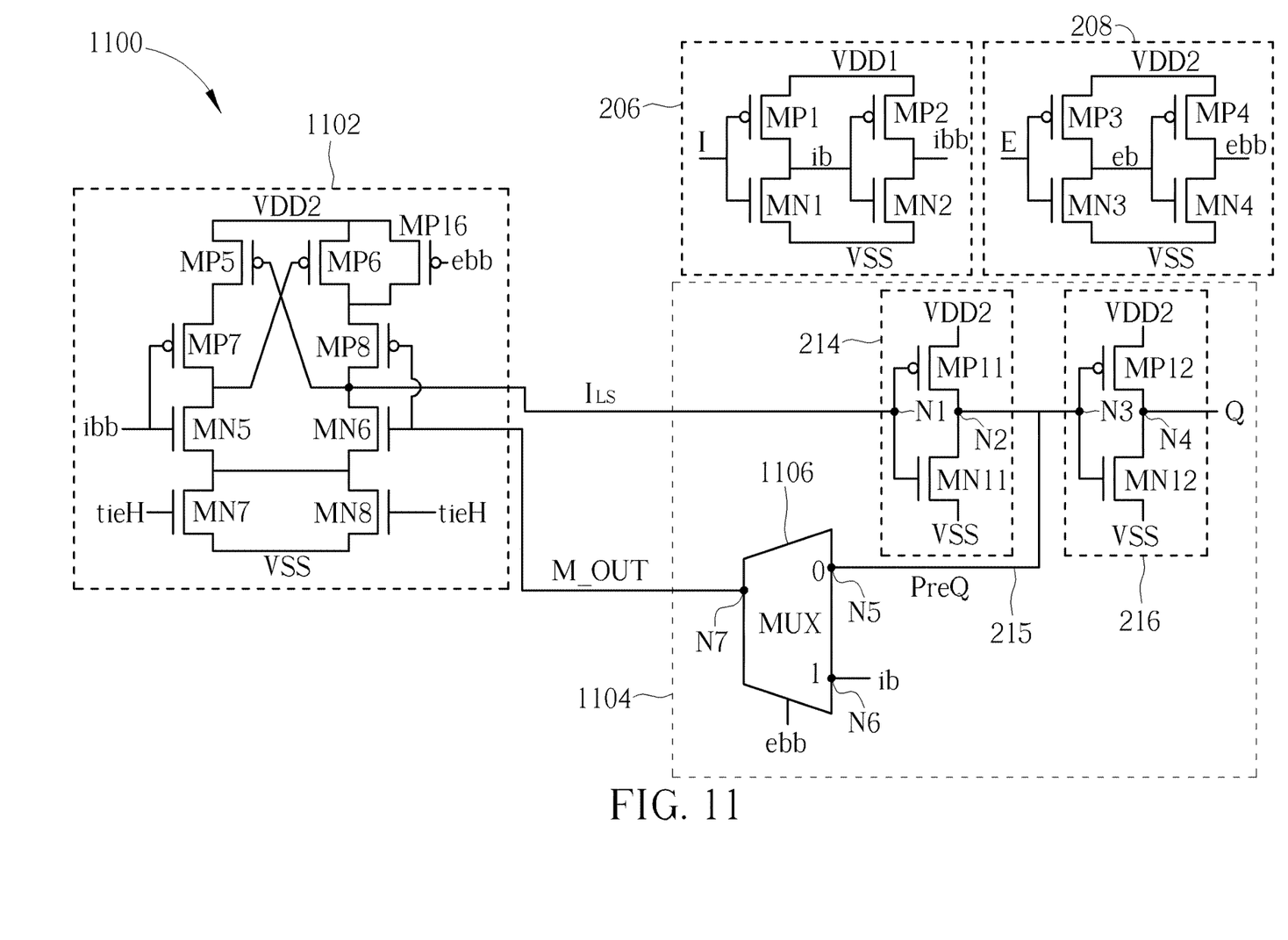
FIG. 11 is a circuit diagram of a fifth level converting enable latch design according to an embodiment of the present invention.

FIG. 11 is a circuit diagram of a fifth level converting enable latch design according to an embodiment of the present invention. The level converting enable latch 1100 follows the architecture shown in FIG. 1, and includes a level shifter circuit 1102 and a latch circuit 1104. In addition, the level converting enable latch 1100 may further include the aforementioned signal generation circuits 206 and 208 that act as buffers for providing cleaner data input signal(s) and cleaner latch enable signal(s). However, this is not meant to be a limitation of the present invention. Alternatively, the signal generation circuit 206 may be modified to omit PMOS transistor MP2 and NMOS transistor MN2, such that the data input signal I and an inverse of the data input signal I (i.e., data input signal ib) may be used by the level shifter circuit 1102 and the latch circuit 1104. In addition, the signal generation circuit 208 may be omitted, such that the latch enable signal E may be directly used by the level shifter circuit 1102 and the latch circuit 1104.

The level shifter circuit 1102 is arranged to receive the data input signal ibb, and generate and output the data output signal $I_{LS}$. In this embodiment, the data output signal $I_{LS}$ may be regarded as a level-shifting version of the data input signal ibb. Specifically, the data input signal ibb of the level shifter circuit 1102 has a voltage swing of (VDD1-VSS), while the data output signal $I_{LS}$ of the level shifter circuit 1102 has a voltage swing of (VDD2-VSS). In this embodiment, the level shifter circuit 1102 employs cross-coupled level shifter architecture, and therefore can support both VDD1>VDD2 and VDD1<VDD2. The major difference between the level shifter circuits 1102 and 202 is that the data input signal ibb is received by gate terminals of PMOS transistor MP7 and NMOS transistor MN5, a multiplexer output M_OUT is received by gate terminals of PMOS transistor MP8 and NMOS transistor MN6, and an additional PMOS transistor MP16 has a source terminal coupled to the power supply voltage VDD2, a drain terminal coupled to the source terminal of the PMOS transistor MP8, and a gate terminal arranged to receive the latch enable signal ebb.

It should be noted that the NMOS transistors MN7 and MN8 act as footer transistors for ESD protection. In some embodiments, the level shifter circuit 1102 may be modified to omit the NMOS transistors MN7 and MN8 and directly couple source terminals of the NMOS transistors MN5 and MN6 to the ground voltage VSS.

The latch circuit 1104 includes a multiplexer (MUX) 1106 and the aforementioned inverters 214 and 216. The multiplexer 1106 has one input node N5 coupled to the output node N2 of the inverter 214 and arranged to receive an internal signal preQ of the latch circuit 1104, another input node N6 arranged to receive the data input signal ib, and an output node N7 arranged to output the multiplexer output signal M_OUT. The multiplexer 1106 is controlled by a selection signal that is set by the latch enable signal ebb. That is, the multiplexer 1106 refers to the latch enable signal ebb to select one of the internal signal preQ and the data input signal ib as the multiplexer output signal M_OUT.

When the latch enable signal E is set to the logic value 1, the latch enable signal ebb has the logic value 1. Hence, the PMOS transistor MP16 is turned off and the multiplexer 1106 selects the data input signal ib as the multiplexer output signal M_OUT (i.e., M_OUT=ib), which makes the level shifter circuit 1102 work normally. To put it another way, the multiplexer 1106 acts as a control circuit that disables the latch feedback loop 215 when the latch enable signal E is set to the logic value 1. The operation of the level shifter circuit 1102 is similar to that of the level shifter circuit 702, where the data output signal $I_{LS}$ may be regarded as a level-shifting version of the data input signal ibb, and the data output signal Q is set in response to the data output signal $I_{LS}$ through inverters 214 and 216.

When the latch enable signal E is set to the logic value 0, the latch enable signal ebb has the logic value 0. Hence, the PMOS transistor MP16 is turned on, and the multiplexer 1106 selects the internal signal preQ as the multiplexer output signal M_OUT (i.e., M_OUT=preQ). To put it another way, the multiplexer 1106 acts as a control circuit that enables the latch feedback loop 215 when the latch enable signal E is set to the logic value 0. In addition, the level shifter circuit 1102 has a quasi-inverter (which consists of PMOS transistor MP8 and NMOS transistor MN6) that can be reused when the PMOS transistor MP16 is turned on. Specifically, when the PMOS transistor MP16 is turned on, the quasi-inverter (which consists of PMOS transistor MP8 and NMOS transistor MN6) becomes a latch feedback inverter that sets an input signal (i.e., data output signal $I_{LS}$) of the inverter 214 by inverting the multiplexer output signal M_OUT (M_OUT=preQ).

In this embodiment, the latch circuit 1104 is a high-enable type latch. When E=ebb=1, the PMOS transistor MP16 is turned off, and the multiplexer 1106 selects the data input signal ib as the multiplexer output signal M_OUT, such that the latch feedback loop 215 is cut off, the level shifter circuit 702 works normally to generate and output the data output signal $I_{LS}$, and the data output signal Q is set in response to the data output signal $I_{LS}$ through the inverters 214 and 216. When E=ebb=0, the PMOS transistor MP16 is turned on, and the multiplexer 1106 selects the internal signal preQ of the latch circuit 1104 as the multiplexer output signal M_OUT, such that the latch feedback loop 215 is enabled, a quasi-inverter of the level shifter circuit 1102 becomes a latch feedback inverter, and the data output signal Q is latched through the multiplexer 1106, the quasi-inverter of the level shifter circuit 1102, and the inverters 214 and 216.

As illustrated in FIG. 4, during a period in which the latch enable signal E is set to the logic value 1, the data output signal Q is set in response to the data input signal I; and during a period in which the latch enable signal E is set to the logic value 0, the data output signal Q is latched, regardless of the data input signal I. Since the data output signal Q is latched, the power supply VDD1 of the power down domain can be shut down for power saving.

Figure 12:
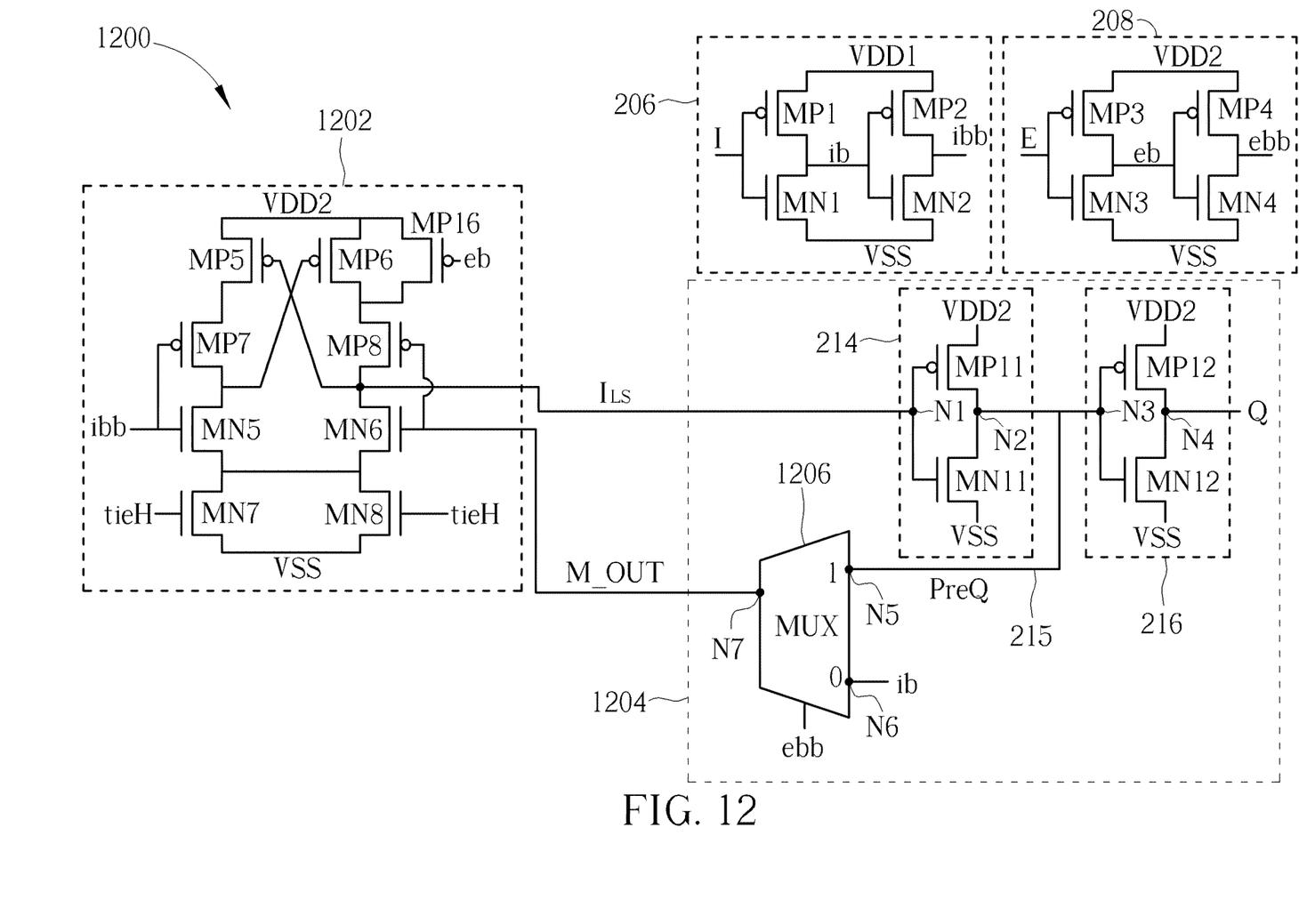
FIG. 12 is a circuit diagram of a sixth level converting enable latch design according to an embodiment of the present invention.

FIG. 12 is a circuit diagram of a sixth level converting enable latch design according to an embodiment of the present invention. The level converting enable latch 1200 follows the architecture shown in FIG. 1. The major difference between the level converting enable latches 1200 and 1100 is that, a PMOS transistor MP16 of a level shifter circuit 1202 has a gate terminal arranged to receive the latch enable signal eb, and a multiplexer 1206 of a latch circuit 1204 is arranged to select the data input signal ib as the multiplexer output signal M_OUT when the latch enable signal ebb is set to the logic value 0 and arranged to select the internal signal preQ of the latch circuit 1204 as the multiplexer output signal M_OUT when the latch enable signal ebb is set to the logic value 1.

In this embodiment, the latch circuit 1204 is a low-enable type latch. When E=ebb=0 and eb=1, the PMOS transistor MP16 is turned off, and the multiplexer 1106 selects the data input signal ib as the multiplexer output signal M_OUT, such that the latch feedback loop 215 is cut off, the level shifter circuit 702 works normally to generate and output the data output signal $I_{LS}$, and the data output signal Q is set in response to the data output signal $I_{LS}$ through the inverters 214 and 216. When E=ebb=2 and eb=0, the PMOS transistor MP16 is turned on, and the multiplexer 1106 selects the internal signal preQ of the latch circuit 1104 as the multiplexer output signal M_OUT, such that the latch feedback loop 215 is enabled, a quasi-inverter of the level shifter circuit 1102 becomes a latch feedback inverter, and the data output signal Q is latched through the multiplexer 1106, the quasi-inverter of the level shifter circuit 1102, and the inverters 214 and 216.

As illustrated in FIG. 6, during a period in which the latch enable signal E is set to the logic value 0, the data output signal Q is set in response to the data input signal I; and during a period in which the latch enable signal E is set to the logic value 1, the data output signal Q is latched, regardless of the data input signal I. Since the data output signal Q is latched, the power supply VDD1 of the power down domain can be shut down for power saving.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A level converting enable latch, comprising:
a level shifter circuit, arranged to receive a first data input signal, and generate and output a first data output signal, wherein a voltage swing of the first data output signal is different from a voltage swing of the first data input signal; and
a latch circuit, arranged to receive the first data output signal and set a second data output signal in response to the first data output signal when a latch enable signal is set to a first logic value, and latch the second data output signal when the latch enable signal is set to a second logic value that is different from the first logic value, wherein the latch circuit comprises:
a first control circuit, arranged to enable a latch feedback loop of the latch circuit when the latch enable signal is set to the second logic value, and disable the latch feedback loop of the latch circuit when the latch enable signal is set to the first logic value;
wherein the level shifter circuit comprises:
a first transistor, having a control terminal arranged to receive the first data input signal;
a second transistor, having a control terminal arranged to receive a second data input signal that is an inverse of the first data input signal;
a first footer transistor, having a first connection terminal coupled to a first connection terminal of the first transistor and a second connection terminal coupled to a reference voltage, wherein the first footer transistor is turned on when the latch enable signal is set to the first logic value, and is turned off when the latch enable signal is set to the second logic value; and
a second footer transistor, having a first connection terminal coupled to a first connection terminal of the second transistor and a second connection terminal coupled to the reference voltage, wherein the second footer transistor is turned on when the latch enable signal is set to the first logic value, and is turned off when the latch enable signal is set to the second logic value;
wherein the first data output signal is output at a second connection terminal of the second transistor.

2. The level converting enable latch of claim 1, wherein the level shifter circuit employs cross-coupled level shifter architecture.

3. The level converting enable latch of claim 1, wherein the level shifter circuit further comprises:
a third transistor, having a control terminal coupled to the second connection node of the second transistor;
a fourth transistor, having a control terminal coupled to a second connection node of the first transistor; and
a fifth transistor, having a first connection node coupled to another reference voltage and a second connection node coupled to the second connection node of the first transistor, wherein the fifth transistor is turned on when the latch enable signal is set to the second logic value, and is turned off when the latch enable signal is set to the first logic value.

4. The level converting enable latch of claim 1, wherein the latch circuit further comprises:
an inverter, having an input node coupled to an output node of the first control circuit, and an output node coupled to an input node of the first control circuit;
wherein when the latch enable signal is set to the second logic value, the first control circuit is further arranged to act as an inverter for inverting an output signal of the inverter to set an input signal of the inverter.

5. The level converting enable latch of claim 4, wherein the input node of the inverter is further arranged to receive the first data output signal when the latch enable signal is set to the first logic value.

6. A level converting enable latch, comprising:
a level shifter circuit, arranged to receive a first data input signal, and generate and output a first data output signal, wherein a voltage swing of the first data output signal is different from a voltage swing of the first data input signal; and
a latch circuit, arranged to receive the first data output signal and set a second data output signal in response to the first data output signal when a latch enable signal is set to a first logic value, and latch the second data output signal when the latch enable signal is set to a second logic value that is different from the first logic value, wherein the latch circuit comprises:
a first control circuit, arranged to enable a latch feedback loop of the latch circuit when the latch enable signal is set to the second logic value, and disable the latch feedback loop of the latch circuit when the latch enable signal is set to the first logic value;
wherein the level shifter circuit comprises:
a first transistor, having a control terminal arranged to receive the first data input signal;
a second transistor, having a control terminal coupled to the control terminal of the first transistor, and a first connection terminal coupled to a connection terminal of the first transistor;
a third transistor, having a connection terminal arranged to output the first data output signal;
a fourth transistor, having a control terminal coupled to a control terminal of the third transistor, and a first connection terminal coupled to the connection terminal of the third transistor;
a fifth transistor, having a control terminal coupled to the connection terminal of the third transistor, a first connection terminal coupled to a second connection terminal of the second transistor, and a second connection terminal coupled to a reference voltage;
a sixth transistor, having a control terminal coupled to the connection terminal of the first transistor, a first connection terminal coupled to a second connection terminal of the fourth transistor, and a second connection terminal coupled to the reference voltage; and
a seventh transistor, having a first connection terminal coupled to the second connection terminal of the fourth transistor, and a second connection terminal coupled to the reference voltage, wherein the seventh transistor is turned off when the latch enable signal is set to the first logic value, and is turned on when the latch enable signal is set to the second logic value;
the first control circuit comprises:
a multiplexer, having a first input node arranged to receive an internal signal of the latch circuit, a second input node arranged to receive a second data input signal that is an inverse of the first data input signal, and an output node arranged to output a multiplexer output signal to both of the control terminal of the third transistor and the control terminal of the fourth transistor, wherein the multiplexer selects the internal signal as the multiplexer output signal when the latch enable signal is set to the second logic value, and selects the second data input signal as the multiplexer output signal when the latch enable signal is set to the first logic value.

7. The level converting enable latch of claim 6, wherein the latch circuit further comprises:
a first inverter; and
a second inverter, having an input node coupled to an output node of the first inverter and the first input node of the multiplexer.

8. The level converting enable latch of claim 7, wherein an input node of the first inverter is arranged to receive the first data output signal.

9. A level converting enable latch, comprising:
a level shifter circuit, arranged to receive a first data input signal, and generate and output a first data output signal, wherein a voltage swing of the first data output signal is different from a voltage swing of the first data input signal; and
a latch circuit, arranged to receive the first data output signal and set a second data output signal in response to the first data output signal when a latch enable signal is set to a first logic value, and latch the second data output signal when the latch enable signal is set to a second logic value that is different from the first logic value;
wherein the level shifter circuit comprises:
a first transistor, having a control terminal arranged to receive the first data input signal;
a second transistor, having a control terminal arranged to receive a second data input signal that is an inverse of the first data input signal;
a first footer transistor, having a first connection terminal coupled to a first connection terminal of the first transistor and a second connection terminal coupled to a reference voltage, wherein the first footer transistor is turned on when the latch enable signal is set to the first logic value, and is turned off when the latch enable signal is set to the second logic value; and
a second footer transistor, having a first connection terminal coupled to a first connection terminal of the second transistor and a second connection terminal coupled to the reference voltage, wherein the second footer transistor is turned on when the latch enable signal is set to the first logic value, and is turned off when the latch enable signal is set to the second logic value;
wherein the first data output signal is output at a second connection terminal of the second transistor.

10. The level converting enable latch of claim 9, wherein the level shifter circuit further comprises:
a third transistor, having a control terminal coupled to the second connection node of the second transistor;
a fourth transistor, having a control terminal coupled to a second connection node of the first transistor; and
a fifth transistor, having a first connection node coupled to another reference voltage and a second connection coupled to the second connection node of the first transistor, wherein the fifth transistor is turned on when the latch enable signal is set to the second logic value, and is turned off when the latch enable signal is set to the first logic value.

* * * * *